United States Patent
Corban et al.

(10) Patent No.: US 11,355,902 B2
(45) Date of Patent: Jun. 7, 2022

(54) POWER CONNECTOR FOR A BUS BAR

(71) Applicant: TE CONNECTIVITY CORPORATION, Berwyn, PA (US)

(72) Inventors: Jevon Ryan Corban, Nashua, NH (US); David Patrick Orris, Middletown, PA (US); Michael James Horning, Landisville, PA (US); Howard Wallace Andrews, Jr., Hummelstown, PA (US); Douglas Edward Shirk, Elizabethtown, PA (US); David Robert Baechtle, Dillsburg, PA (US)

(73) Assignee: TE CONNECTIVITY SERVICES GMBH, Schaffhausen (CH)

( * ) Notice: Subject to any disclaimer, the term of this patent is extended or adjusted under 35 U.S.C. 154(b) by 392 days.

(21) Appl. No.: 16/739,917

(22) Filed: Jan. 10, 2020

(65) Prior Publication Data

US 2020/0244050 A1  Jul. 30, 2020

Related U.S. Application Data

(60) Provisional application No. 62/797,766, filed on Jan. 28, 2019.

(51) Int. Cl.
| | |
|---|---|
| *H02B 1/20* | (2006.01) |
| *H01R 13/11* | (2006.01) |
| *H01R 13/187* | (2006.01) |
| *H01R 24/58* | (2011.01) |

(52) U.S. Cl.
CPC ............. *H02B 1/20* (2013.01); *H01R 13/113* (2013.01); *H01R 13/187* (2013.01); *H01R 24/58* (2013.01)

(58) Field of Classification Search
CPC .... H01R 13/113; H01R 13/187; H01R 24/58; H01R 25/142; H02B 1/20; H05K 7/1492; H02G 5/007
See application file for complete search history.

(56) References Cited

U.S. PATENT DOCUMENTS

| | | | | |
|---|---|---|---|---|
| 8,197,289 | B1* | 6/2012 | Faber | H02B 11/04 |
| | | | | 439/819 |
| 8,339,773 | B2* | 12/2012 | Frassineti | H01H 1/58 |
| | | | | 361/677 |
| 8,730,652 | B2* | 5/2014 | Faber | H02B 11/04 |
| | | | | 361/624 |
| 10,581,196 | B2* | 3/2020 | Liu | H01R 25/162 |
| 11,177,599 | B2* | 11/2021 | Horning | H01R 13/14 |

(Continued)

*Primary Examiner* — Robert J Hoffberg

(57) ABSTRACT

A power connector includes first and second power terminals having first and second contact stacks and first and second plates for termination to corresponding power element. The contact stacks have contacts separate and discrete from each other and from the plate. Each contact has a base and a mating beam. The bases are aligned and mechanically and electrically coupled to the plate. A housing has an end wall and a fastener that mechanically and electrically couples the bases to the plate. The power terminals are arranged such that the first and second mating beams oppose each other across a mating slot that receives a bus bar with the first mating beams mechanically and electrically engaging a first bus rail at a first side of the bus bar and the second mating beams mechanically and electrically engaging a second bus rail at a second side of the bus bar.

20 Claims, 6 Drawing Sheets

(56) References Cited

U.S. PATENT DOCUMENTS

2016/0020052 A1* 1/2016 Kaufman ............. H01R 25/162
　　　　　　　　　　　　　　　　　　　　439/121
2021/0175645 A1* 6/2021 Li ........................ H01R 25/145

* cited by examiner

POWER CONNECTOR FOR A BUS BAR

CROSS REFERENCE TO RELATED APPLICATIONS

This application claims benefit to U.S. Provisional Application No. 62/797,766, filed Jan. 28, 2019, titled "POWER CONNECTOR FOR A BUS BAR", the subject matter of which is herein incorporated by reference in its entirety.

BACKGROUND OF THE INVENTION

The subject matter herein relates generally to power connectors.

Power connectors are used in systems, such as communication systems for powering components of the system. For example, power connectors are used in networks, such as servers, switches and the like for powering the server or switch components. In some known systems, the components are held in a rack and the power system includes a bus bar to supply power for the components held in the rack. The power connectors tap into the bus bar to take or supply power from the bus bar for the components. Some known systems include a tap bus bar electrically connected to the power connector. Some system developers require power connectors to have certain height requirements, such as to fit within a rack unit or open rack unit (for example, 48 mm) height requirement. Some known systems have high power demands, such as requiring high current and/or high voltage power connections between the bus bar other components of the system. For example, some power connectors may be designed for up to 500 amp connections or more.

A need remains for a low profile, high current power connector, which may have a separable mating interface with a bus bar and/or be variably positionable along a bus bar for system design flexibility.

BRIEF DESCRIPTION OF THE INVENTION

In an embodiment, a power connector is provided including a first power terminal that has a first contact stack and a first plate for termination to a first power element. The first contact stack has first contacts separate and discrete from each other and separate and discrete from the first plate. The first contacts being mechanically and electrically coupled together in the first contact stack. Each first contact has a base and a mating beam extending from the base. The bases of the first contacts are aligned with each other and are mechanically and electrically coupled to the first plate. The mating beams extend forward of an end of the first plate. The power connector includes a second power terminal having a second contact stack and a second plate for termination to a second power element. The second contact stack has second contacts separate and discrete from each other and separate and discrete from the second plate. The second contacts are mechanically and electrically coupled together in the second contact stack. Each second contact has a base and a mating beam extending from the base. The bases of the second contacts are aligned with each other and are mechanically and electrically coupled to the second plate. The mating beams extend forward of an end of the second plate. The power connector includes a housing. The housing includes an end wall and at least one fastener. The end wall extends along the bases of the first contacts and the bases of the second contacts. The at least one fastener is secured to the end wall to mechanically and electrically couple the bases of the first contacts to the first plate and the bases of the second contacts to the second plate. The first power terminals and the second power terminals are arranged such that the mating beams of the first power terminal and the mating beams of the second power terminal oppose each other across a mating slot that is configured to receive a bus bar. The mating beams of the first power terminal are configured to mechanically and electrically engage a first bus rail at a first side of the bus bar and the mating beams of the second power terminal being are configured to mechanically and electrically engage a second bus rail at a second side of the bus bar.

In another embodiment, a power connector is provided including a first power terminal that has a first upper contact stack, a first lower contact stack and a first plate sandwiched between the first upper contact stack and the first lower contact stack. The first plate is for termination to a first power element. The first upper contact stack has first upper contacts that are separate and discrete from each other and separate and discrete from the first plate. The first lower contact stack has first lower contacts that are separate and discrete from each other and separate and discrete from the first plate. Each first upper contact has a first upper base and a first upper mating beam that extends from the first upper base. Each first lower contact has a first lower base and a first lower mating beam that extends from the first lower base. The first upper bases are aligned with the first lower bases on opposite sides of the first plate. The first upper mating beams are aligned with the first lower mating beams forward of an end of the first plate. The power connector includes a second power terminal that has a second upper contact stack, a second lower contact stack and a second plate sandwiched between the second upper contact stack and the second lower contact stack. The second plate is for termination to a second power element. The second upper contact stack has second upper contacts that are separate and discrete from each other and separate and discrete from the second plate. The second lower contact stack has second lower contacts that are separate and discrete from each other and separate and discrete from the second plate. Each second upper contact has a second upper base and a second upper mating beam that extends from the second upper base. Each second lower contact has a second lower base and a second lower mating beam that extends from the second lower base. The second upper bases are aligned with the second lower bases on opposite sides of the second plate. The second upper mating beams are aligned with the second lower mating beams forward of an end of the second plate. The power connector includes a housing. The housing includes an upper end wall, a lower end wall and at least one fastener. The upper end wall extends along the first and second upper bases. The lower end wall extends along the first and second lower bases. The at least one fastener is secured to at least one of the upper end wall and the lower end wall to mechanically and electrically couple the first contacts to the first plate and the second contacts to the second plate. The first power terminals and the second power terminals are arranged such that the first upper mating beams oppose the second upper mating beams and the first lower mating beams oppose the second lower mating beams across a mating slot. The mating slot is configured to receive a bus bar. The first upper mating beams and the first lower mating beams re configured to mechanically and electrically engage a first bus rail at a first side of the bus bar. The second upper mating beams and the second lower mating beams are configured to mechanically and electrically engage a second bus rail at a second side of the bus bar.

In a further embodiment, a power system for a bus bar is provided. The power system has a first bus rail and a second bus rail. The power system includes a first power element that has a first mating interface. The power system includes a second power element that has a second mating interface. The power system includes a power connector that is configured to electrically connect the first bus rail with the first power element and the second bus rail with the second power element. The power connector includes a first power terminal that has a first contact stack and a first plate terminated to the first power element. The first contact stack has first contacts separate and discrete from each other and separate and discrete from the first plate. The first contacts are mechanically and electrically coupled together in the first contact stack. Each first contact has a base and a mating beam that extend from the base. The bases of the first contacts are aligned with each other and are mechanically and electrically coupled to the first plate. The mating beams extend forward of an end of the first plate. The power connector includes a second power terminal that has a second contact stack and a second plate terminated to the second power element. The second contact stack has second contacts separate and discrete from each other and separate and discrete from the second plate. The second contacts are mechanically and electrically coupled together in the second contact stack. Each second contact has a base and a mating beam that extend from the base. The bases of the second contacts are aligned with each other and are mechanically and electrically coupled to the second plate. The mating beams extend forward of an end of the second plate. The power connector includes a housing. The housing includes an end wall and at least one fastener. The end wall extends along the bases of the first contacts and the bases of the second contacts. The at least one fastener is secured to the end wall to mechanically and electrically couple the bases of the first contacts to the first plate and the bases of the second contacts to the second plate. The first power terminals and the second power terminals are arranged such that the mating beams of the first power terminal and the mating beams of the second power terminal oppose each other across a mating slot that is configured to receive the bus bar. The mating beams of the first power terminal are configured to mechanically and electrically engage the first bus rail at a first side of the bus bar. The mating beams of the second power terminal are configured to mechanically and electrically engage the second bus rail at a second side of the bus bar. The first power terminal electrically connects the first power element to the first rail and the second power terminal electrically connects the second power element to the second rail at a separable mating interface with the bus bar.

DETAILED DESCRIPTION OF THE INVENTION

Figure 1:
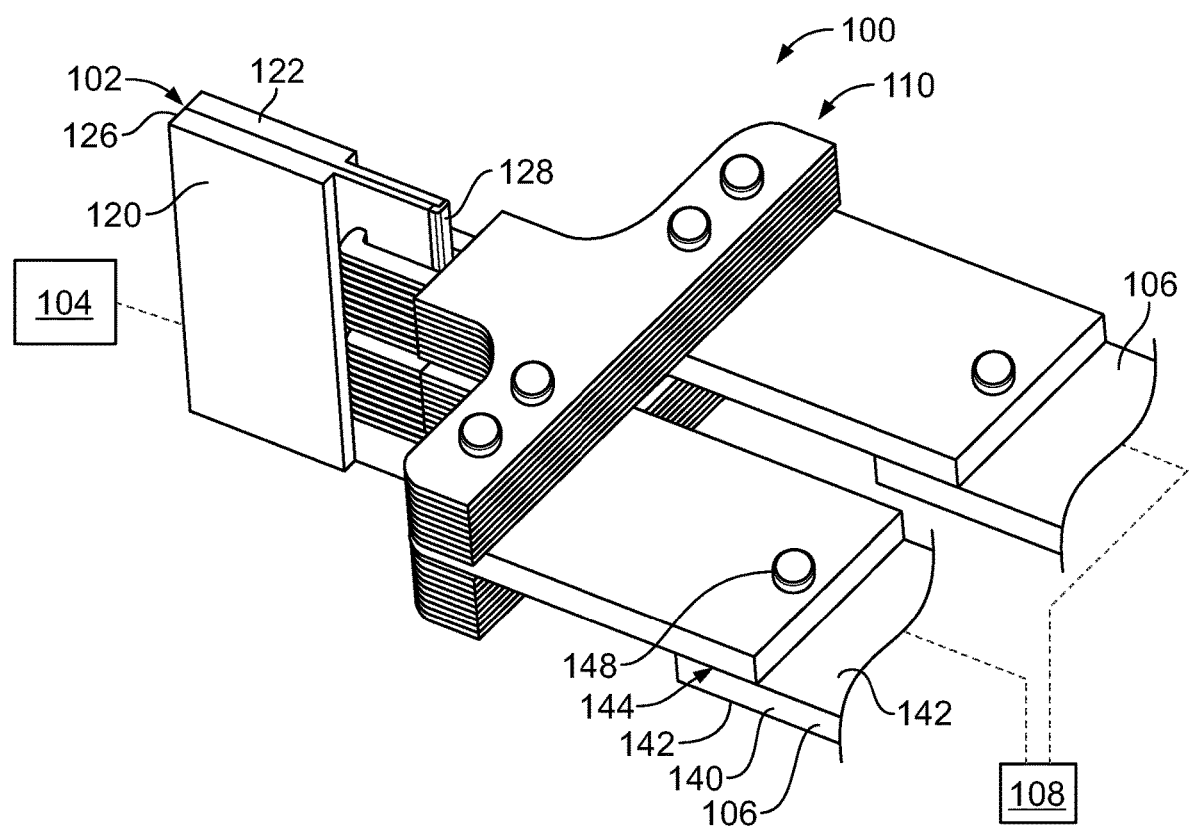
FIG. 1 illustrates a power system having an electrical connector in accordance with an exemplary embodiment.

FIG. 1 illustrates a power system 100 in accordance with an exemplary embodiment. The power system 100 includes a bus bar 102 electrically connected to a component 104 and one or more power elements 106 electrically connected to a component 108. A power connector 110 electrically connects the power elements 106 to the bus bar 102. In various embodiments, the power connector 110 may be used as a supply power connector to supply power to the bus bar 102. In other embodiments, the power connector 110 may be used as a tap power connector to tap into a power supply of the distribution bus bar 102.

In various embodiments, the power system 100 may be part of a data communication system, such as a data center, switch, router, server, hub, network, or data storage system. For example, the component 108 may include a rack or cabinet. Cable assemblies may be routed between various components of the communication system. The communication system may include a plurality of shelves or drawers stacked within the rack. Components of the communication system may be powered by the bus bar 102, such as through the power connector 110. The communication system may include one or more switches to provide electrical switching within the communication system. Various panel mount connector assemblies may be electrically connected to the switch with cables routed from the switch to other panel mount connector assemblies at various other shelves within the communication system. In various embodiments, the communication system servers configured to be electrically connected to corresponding connector assemblies and may be powered by the power connector. The servers may be electrically connected to the switch by the cables.

The bus bar 102 includes a first bus rail 120 and a second bus rail 122. For example, the first bus rail 120 may be a positive rail and the second bus rail 122 may be a negative rail. The bus bar 102 may include a cover (not shown) that covers the bus rails 120, 122. The bus bar 102 extends between a front 126 and a rear 128. The power connector 110 is coupled to the rear 128 of the bus bar 102. Optionally, the bus bar 102 may be oriented vertically with the bus rails 120, 122 extending vertically. Other orientations are possible in alternative embodiments. In an exemplary embodiment, each bus rail 120, 122 includes a metal plate having sides extending to a mating edge. Each bus rail 120, 122 may be a copper plate. In various embodiments, the bus rails 120, 122 may be arranged back-to-back as a single bus bar. The bus bar 102 may be a dual pole bus bar. For example, the bus rails 120, 122 may be laminated together and electrically isolated having opposite polarity carrying positive and negative charges. In other embodiments, the bus bar 102 may be a single pole bus bar with the first and second bus rails 120, 122 having a single polarity. The power connector 110 is coupled to the mating edges at the sides of the bus rails 120, 122.

In the illustrated embodiment, the power elements 106 include metal plates 140 having sides 142. For example, the plate 140 may be a copper plate. The power element 106 has a mating interface 144 at an end of the plate 140. The mating interface 144 is configured to be mated with the power connector 110. In the illustrated embodiment, the mating interface 144 is defined by an end of the plate 140. The plate 140 includes openings (not shown) at the mating interface 144 for receiving a fastener 148 to mechanically and electrically secure the power element 106 to the power connector 110. In an exemplary embodiment, the power element 106 may include a second mating interface (not shown) at the opposite end to mechanically and electrically connect the power element 106 to another component, such as at the component 108. In the illustrated embodiment, the plate 140 is planar and rectangular. However, the power element 106 may have other shapes in alternative embodiments, such as being formed or bent into an alternative shape. In the illustrated embodiment, the plates 140 are oriented horizontally. Other orientations are possible in alternative embodiments. In various alternative embodiments, the power elements 106 may be power wires configured to be terminated to the power connector 110 rather than a metal plate. The metal plate 140 may be a bus bar.

Figure 2:
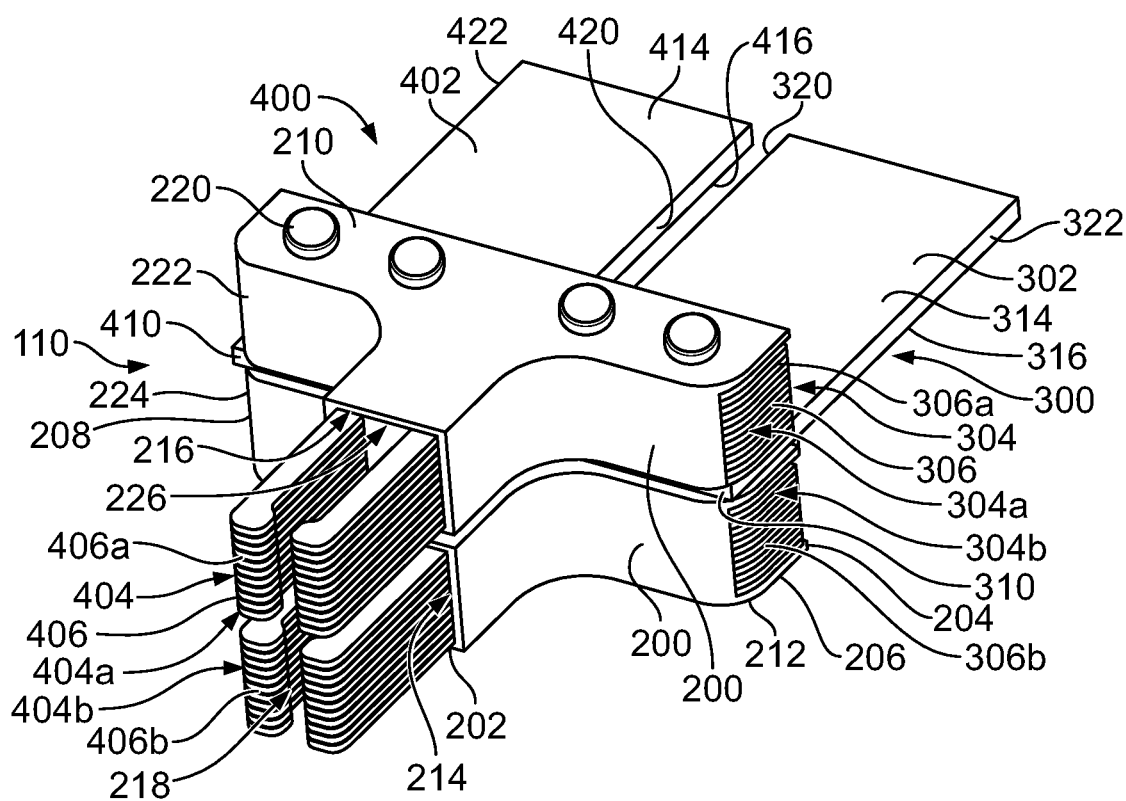
FIG. 2 is a front perspective view of the power connector in accordance with an exemplary embodiment.

FIG. 2 is a front perspective view of the power connector 110 in accordance with an exemplary embodiment. The power connector 110 includes a housing 200 holding a first power terminal 300 and a second power terminal 400. The first power terminal 300 is configured to be electrically connected to the first bus rail 120 (shown in FIG. 1). The second power terminal 400 is configured to be electrically connected to the second bus rail 122. The first and second power terminals 300, 400 may be similar and include similar components or features.

In various embodiments, the housing 200 is a multi-piece housing. Alternatively, the housing 200 may be a single piece housing 200. The housing 200 has a front 202, a rear 204, a first side 206, a second side 208, a first end wall 210, and a second end wall 212. In the illustrated embodiment, the housing 200 generally conforms to the shape of the power terminals 300, 400; however, the housing 200 may have other shapes in alternative embodiments, such as being box-shaped. Optionally, the first end wall 210 may define a top end and the second end wall 212 may define a bottom end; however, the power connector 110 may have other orientations in alternative embodiments, such as where the first side 206 is a top side and the second side 208 is a bottom side.

The housing 200 includes a first terminal channel 214 that receives the first power terminal 300 and a second terminal channel 216 that receives the second power terminal 400. The terminal channels 214, 216 are open at the rear 204 to receive the power terminals 300, 400. The power terminals 300, 400 extend from the housing 200 through the rear 204, such as for mating with the power elements 106 (shown in FIG. 1). In an exemplary embodiment, the housing 200 may be open at the front 202 and the power terminals 300, 400 may extend forward of the housing 200 through the front 202 for mating with the bus bar 102. The power terminals 300, 400 may be held in the terminal channels 214, 216 by an interference fit in various embodiments.

In an exemplary embodiment, the power connector 110 includes a mating slot 218 at the front. In the illustrated embodiment, the mating slot 218 is defined by the power terminals 300, 400. The mating slot 218 may be at least partially defined by the housing 200 in various embodiments. The mating slot 218 is vertically oriented. The mating slot 218 is open at the front to receive the bus bar 102. The mating slot 218 is open at the top and at the bottom to allow the bus bar 102 to pass through the mating slot 218. The first and second power terminals 300, 400 extend along the mating slot 218 to interface with the bus bar 102. The first power terminal 300 is located along one side of the mating slot 218 for mating with the bus bar 102. The second power terminal 400 is located along the other side of the mating slot 218 for mating with the bus bar 102.

In an exemplary embodiment, the housing 200 is a multipiece housing configured to be assembled together with the power terminals 300, 400 using fasteners 220. For example, the housing 200 includes a first shell 222 and a second shell 224. The first shell 222 forms the first end wall 210 and the second shell 224 forms the second end wall 212. The first and second shells 222, 224 have cavities 226 that receive the power terminals 300, 400. Optionally, the shells 222, 224 may be mirrored halves. The housing 200 has openings (not shown) extending therethrough. The fasteners 220 pass through the openings. The fasteners 220 may be threaded bolts having threaded nuts configured to be secured to the ends of the threaded bolts. Other types of fasteners may be used in alternative embodiments. In an exemplary embodiment, the fasteners 220 are used to mechanically and electrically connect the power connector 110 together. For example, the fasteners 220 hold the contacts, plates, and housings together.

The power terminal 300 includes a plate 302 and a contact stack 304 of contacts 306. The contacts 306 are separate and discrete from each other and separate and discrete from the plate 302. The contacts 306 are mechanically and electrically coupled together in the contact stack 304. The contacts 306 are parallel to each other. In the illustrated embodiment, the contacts 306 are arranged horizontally and are configured to be coupled to the plate 302, which is also oriented horizontally. The contacts 306 abut against each other to form the contact stack 304. In the illustrated embodiment, the power terminal 300 includes the contacts 306 arranged as an upper contact stack 304a of upper contacts 306a and a lower contact stack 304b of lower contacts 306b. The plate 302 is sandwiched between the upper contact stack 304a and the lower contact stack 304b.

The plate 302 is a metal plate, such as a copper plate. Optionally, the plate 302 may be a planar rectangular plate; however, the plate 302 may have other shapes, including bends, steps, and the like, in alternative embodiments. The plate 302 has a front end 310. The contact stack 304 is configured to be coupled to the plate 302 proximate to the front end 310. The plate 302 has a first side 314 and a second side 316 opposite the first side 314. The first side 314 may be a top side and the second side 316 may be a bottom side in various embodiments. The plate 302 includes a first end 320 and a second end 322. In an exemplary embodiment, the plate 302 may include openings (not shown) configured to receive the fasteners 220. The plate 302 is manufactured from a copper material and is highly conductive. The plate 302 has a high current carrying capacity. The plate 302 is thick and wide to carry high current, such as in excess of 400 amps. In various embodiments, the plate 302 may be configured to carry current in excess of 500 amps or more.

The power terminal 400 includes a plate 402 and a contact stack 404 of contacts 406. The contacts 406 are separate and discrete from each other and separate and discrete from the plate 402. The contacts 406 are mechanically and electrically coupled together in the contact stack 404. The contacts 406 are parallel to each other. In the illustrated embodiment, the contacts 406 are arranged horizontally and are configured to be coupled to the plate 402, which is also oriented horizontally. The contacts 406 abut against each other to form the contact stack 404. In the illustrated embodiment, the power terminal 400 includes the contacts 406 arranged as an upper contact stack 404a of upper contacts 406a and a lower contact stack 404b of lower contacts 406b. The plate 402 is sandwiched between the upper contact stack 404a and the lower contact stack 404b.

The plate 402 is a metal plate, such as a copper plate. Optionally, the plate 402 may be a planar rectangular plate; however, the plate 402 may have other shapes, including bends, steps, and the like, in alternative embodiments. The plate 402 has a front end 410. The contact stack 404 is configured to be coupled to the plate 402 proximate to the front end 410. The plate 402 has a first side 414 and a second side 416 opposite the first side 414. The first side 414 may be a top side and the second side 416 may be a bottom side in various embodiments. The plate 402 includes a first end 420 and a second end 422. In an exemplary embodiment, the plate 402 may include openings (not shown) configured to receive the fasteners 220. The plate 402 is manufactured from a copper material and is highly conductive. The plate 402 has a high current carrying capacity. The plate 402 is thick and wide to carry high current, such as in excess of 400 Amps. In various embodiments, the plate 402 may be configured to carry current in excess of 500 Amps or more.

The first and second power terminals 300, 400 may be dual pole power terminals having opposite polarity. For example, the plates 302, 402 may carry opposite positive and negative charges and the contacts 306, 406 may carry opposite positive and negative charges. In other embodiments, the first and second power terminals 300, 400 may be single pole power terminals having single polarity. For example, the plates 302, 402 may carry the same charge (for example, a positive charge or a negative charge) and the contacts 306, 406 may carry the same charge (for example, a positive charge or a negative charge).

Figure 3:
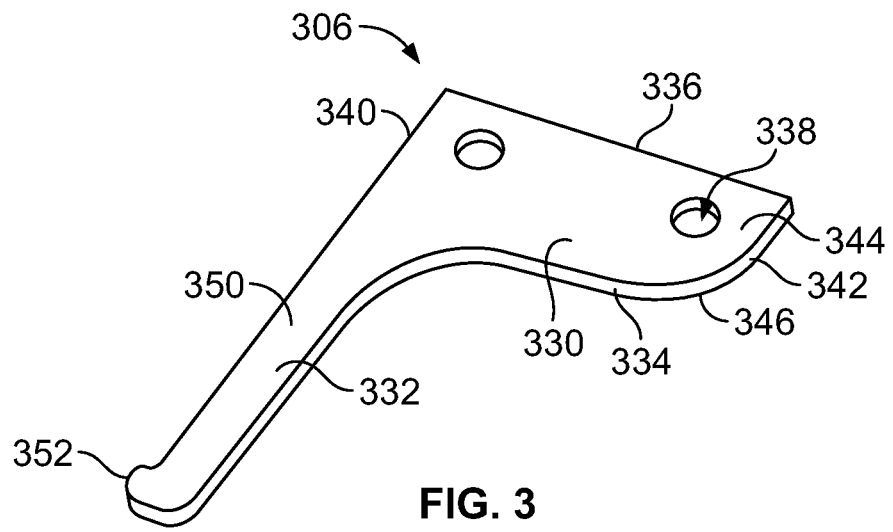
FIG. 3 is a perspective view of one of a contact of the power connector in accordance with an exemplary embodiment.

FIG. 3 is a perspective view of one of the contacts 306 in accordance with an exemplary embodiment. The contact 306 includes a base 330 and a mating beam 332 extending from the base 330. In an exemplary embodiment, the contact 306 is a stamped and formed contact. The contact 306 may be stamped from a metal sheet, such as a copper sheet. The contact 306 is thin, such as compared to the plate 302; however, when the plurality of contacts 306 are arranged in the contact stack 304 the contacts 306 have a high current carrying capacity.

The base 330 has a front 334 and a rear 336. The base 330 includes openings 338 extending therethrough. The base 330 includes an inner side 340 and an outer side 342. The base 330 includes a first surface 344 and a second surface 346. The first and second surfaces 344, 346 are planar. The first and second surfaces 344, 346 are configured to be stacked adjacent other contacts 306 within the contact stack 304.

The mating beam 332 extends forward from the base 330. In an exemplary embodiment, the mating beam 332 extends from the inner side 340. The mating beam 332 is narrower than the base 330. In an exemplary embodiment, the mating beam 332 is deflectable and configured to be mated with the bus bar 102 (shown in FIG. 1). The mating beam 332 includes a mating finger 350 at a distal end 352 of the mating beam 332. The mating finger 350 extends inward from the mating beam 332 and defines a mating interface of the mating beam 332 configured to engage the bus bar 102. Optionally, the mating beam 332 may widen slightly at the transition between the mating beam 332 and the base 330. The contact 306 may have other shapes in alternative embodiments.

Figure 4:
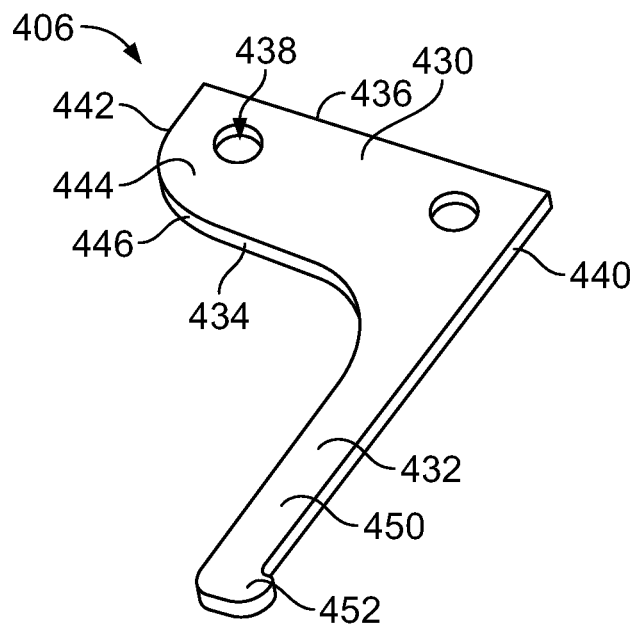
FIG. 4 is a perspective view of a contact of the power connector in accordance with an exemplary embodiment.

FIG. 4 is a perspective view of one of the contacts 406 in accordance with an exemplary embodiment. The contact 406 includes a base 430 and a mating beam 432 extending from the base 430. In an exemplary embodiment, the contact 406 is a stamped and formed contact. The contact 406 may be stamped from a metal sheet, such as a copper sheet. The contact 406 is thin, such as compared to the plate 402; however, when the plurality of contacts 406 are arranged in the contact stack 404 the contacts 406 have a high current carrying capacity.

The base 430 has a front 434 and a rear 436. The base 430 includes openings 438 extending therethrough. The base 430 includes an inner side 440 and an outer side 442. The base 430 includes a first surface 444 and a second surface 446. The first and second surfaces 444, 446 are planar. The first and second surfaces 444, 446 are configured to be stacked adjacent other contacts 406 within the contact stack 404.

The mating beam 432 extends forward from the base 430. In an exemplary embodiment, the mating beam 432 extends from the inner side 440. The mating beam 432 is narrower than the base 430. In an exemplary embodiment, the mating beam 432 is deflectable and configured to be mated with the bus bar 102 (shown in FIG. 1). The mating beam 432 includes a mating finger 450 at a distal end 452 of the mating beams 432. The mating finger 450 extends inward from the mating beam 432 and defines a mating interface of the mating beam 432 configured to engage the bus bar 102. Optionally, the mating beam 432 may widen slightly at the transition between the mating beam 432 and the base 430. The contact 406 may have other shapes in alternative embodiments.

Figure 5:
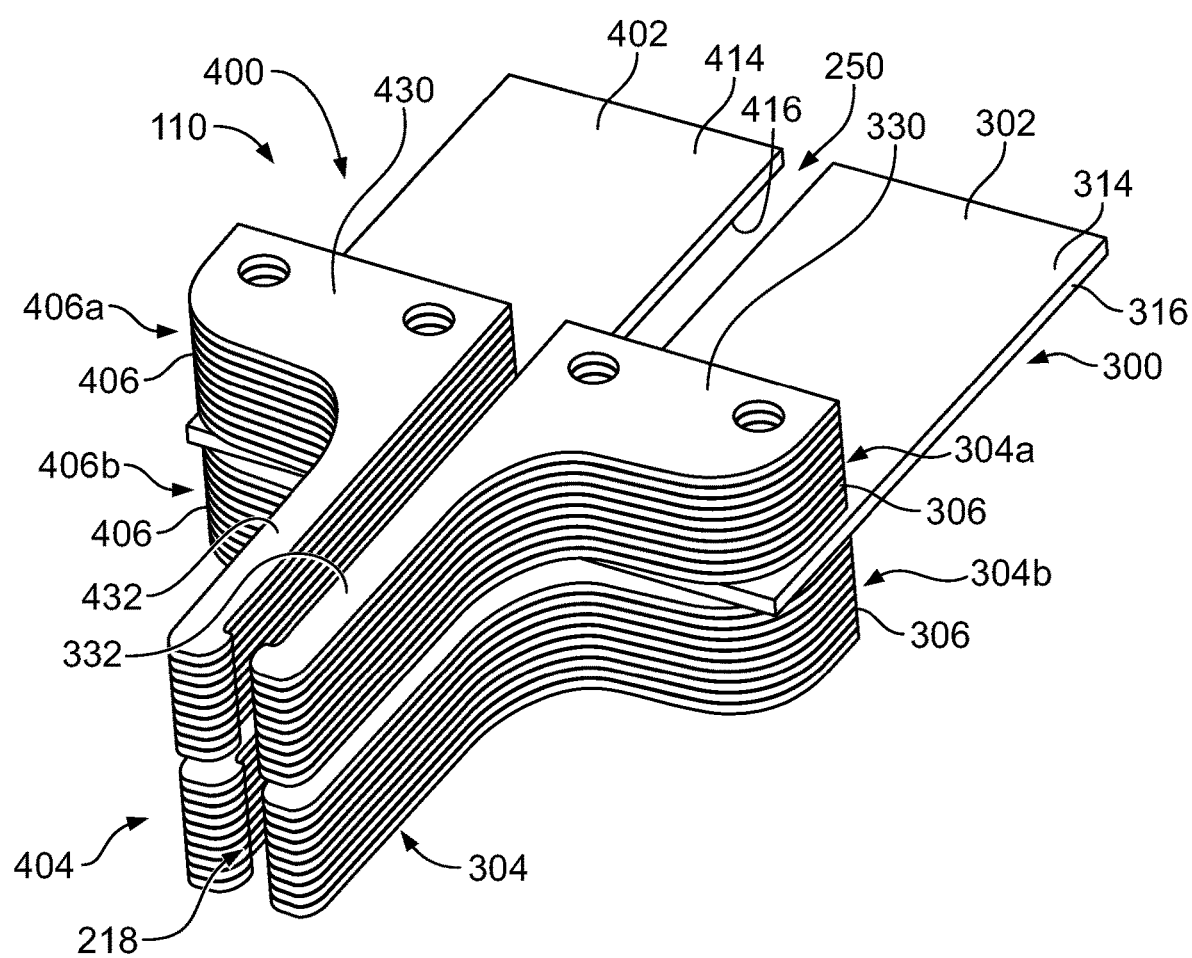
FIG. 5 is a front perspective view of a portion of the power connector illustrating power terminals of the power connector in accordance with an exemplary embodiment.

FIG. 5 is a front perspective view of a portion of the power connector 110 illustrating the power terminals 300, 400 with the housing 200 removed to illustrate the power terminals 300, 400. FIG. 5 illustrates the contacts 306 in the contact stack 304 coupled to the plate 302 and the contacts 406 in the contact stack 404 coupled to the plate 402. The contacts 306 are coupled to the first and second sides 314, 316 such that the plate 302 is sandwiched between the upper contacts 306a and the lower contacts 306b. The contacts 406 are coupled to the first and second sides 414, 416 such that the plate 402 is sandwiched between the upper contacts 406a and the lower contacts 406b. In an exemplary embodiment, each of the adjacent bases 330 abut against each other within the contact stack 304. As such, the adjacent contacts 306 are electrically connected. In an exemplary embodiment, each of the adjacent bases 430 abut against each other within the contact stack 404. As such, the adjacent contacts 406 are electrically connected.

In an exemplary embodiment, the bases 330 of the contacts 306 have a width approximately equal to a width of the plate 302 and the bases 430 of the contacts 406 have a width approximately equal to a width of the plate 402. The plate 302 is separated from the plate 402 by a gap 250. The gap 250 is aligned with the mating slot 218. In the illustrated embodiment, the plates 302, 402 are aligned with each other along a plane that is oriented perpendicular to the mating slot 218. For example, the plane of the plates 302, 402 is oriented horizontally, while the mating slot 218 is oriented vertically to receive the vertical bus bar 102.

When assembled, the first and second power terminals 300, 400 are arranged such that the mating beams 332, 432 oppose each other across the mating slot 218 to receive the bus bar 102 therebetween. Optionally, the mating beams 332 may have equal lengths such that all of the mating fingers 350 are aligned. However, in alternative embodiments, the mating beams 332 may have different lengths such that the mating fingers 350 are staggered, which may reduce mating forces with the bus bar 102 by staggering mating with the bus bar 102. The mating beams 432 may have equal lengths such that all of the mating fingers 450 are aligned. However, in alternative embodiments, the mating beams 432 may have different lengths such that the mating fingers 450 are staggered, which may reduce mating forces with the bus bar 102 by staggering mating with the bus bar 102.

In an exemplary embodiment, each of the mating beams 332 are aligned with each other. For example, the mating beams 332 of the upper contacts 306a and the mating beams 332 of the lower contacts 306b are aligned with each other. As such, the mating beams 332 are configured to mechanically and electrically engage the first bus rail 120 (shown in FIG. 1) of the bus bar 102. In an exemplary embodiment, each of the mating beams 332 are independently movable relative to each other. As such, the mating forces with the bus bar 102 are reduced. In an exemplary embodiment, each of the adjacent mating beams 332 abut against each other within the contact stack 304. As such, the adjacent contacts 306 within the contact stack 304 are electrically connected. Each of the mating beams 432 are aligned with each other. For example, the mating beams 432 of the upper contacts 406a and the mating beams 432 of the lower contacts 406b are aligned with each other. As such, the mating beams 432 are configured to mechanically and electrically engage the second bus rail 122 (shown in FIG. 1) of the bus bar 102. In an exemplary embodiment, each of the mating beams 432 are independently movable relative to each other. As such, the mating forces with the bus bar 102 are reduced. In an exemplary embodiment, each of the adjacent mating beams 432 abut against each other within the contact stack 404. As such, the adjacent contacts 406 within the contact stack 404 are electrically connected.

Returning to FIG. 2, during assembly, the power terminals 300, 400 are assembled with the housing 200 using the fasteners 220. The fasteners 220 pass through the openings in the housing 200, the openings in the contacts 306, 406 and the openings in the plates 302, 402 to mechanically and electrically connect the power terminals 300, 400 together. The fasteners are secured to compress the contacts 306, 406 into mating engagement with the plates 302, 402, respectively. Low resistance interfaces are created between the contacts 306, 406 of the contact stacks 304, 404. Low resistance interfaces are created between the contact stacks 304, 404 and the plates 302, 402, respectively. The power terminals 300, 400 are configured to convey high current between the bus bar 102 and the power elements 106.

Figure 6:
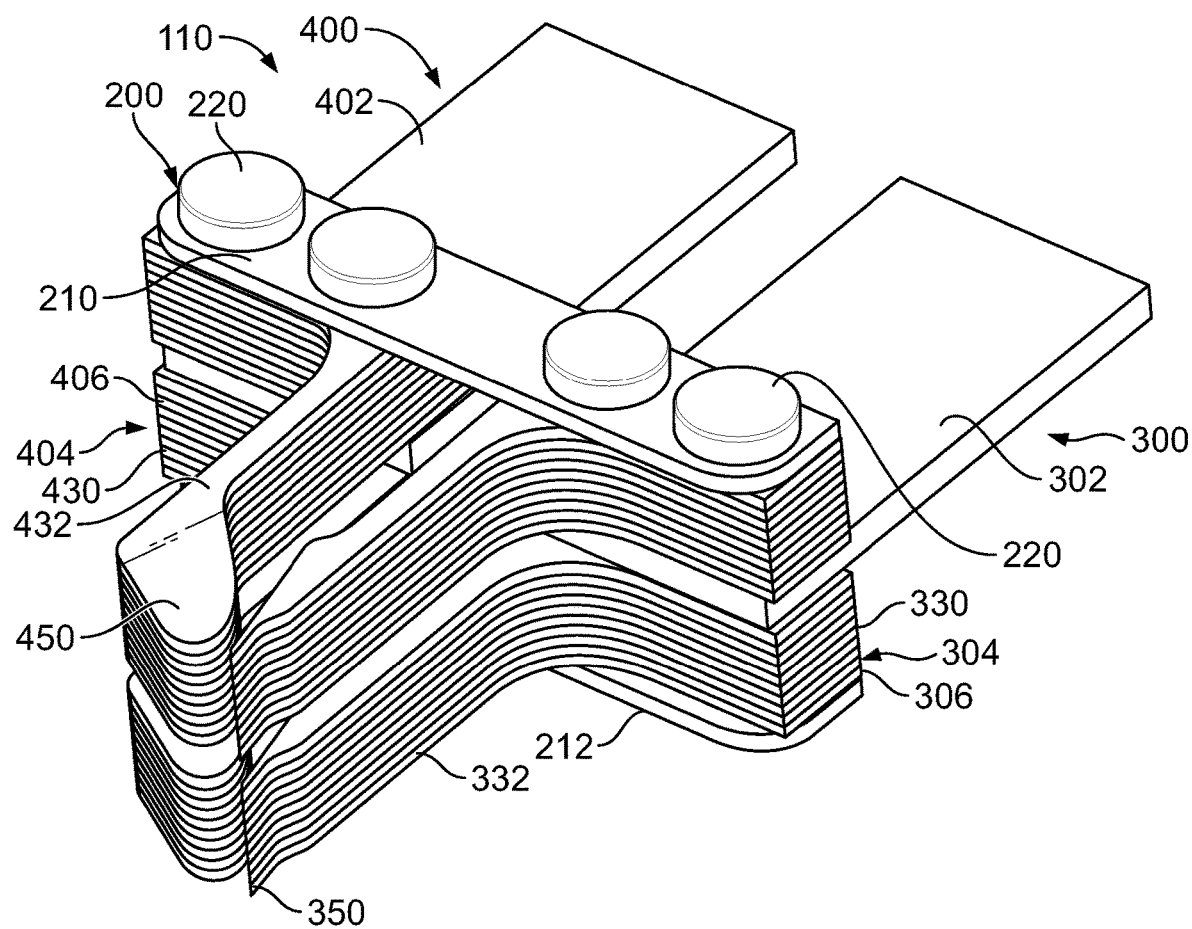
FIG. 6 is a front perspective view of the power connector in accordance with an exemplary embodiment.

FIG. 6 is a front perspective view of the power connector 110 in accordance with an exemplary embodiment. FIG. 6 illustrates the power connector 110 utilizing a different housing 200. FIG. 6 illustrates the contacts 306, 406 having a different mating interface for mating with the bus bar 102 (shown in FIG. 1).

In the illustrated embodiment, the housing 200 is a multipiece housing having the end wall 210 and the end wall 212. The end walls 210, 212 are separate from each other and provided at the top and the bottom of the power terminals 300, 400. The end walls 210, 212 are secured to the power terminals 300, 400 using the fasteners 220. In an exemplary embodiment, the end walls 210, 212 are manufactured from a dielectric material, such as a plastic material to electrically isolate the first power terminal 300 from the second power terminal 400. The end walls 210, 212 mechanically coupled to the first power terminal 300 to the second power terminal 400. For example, the end walls 210, 212 to hold the relative positions of the contact stacks 304, 404 and the plates 302, 402.

In an exemplary embodiment, the contacts 306 are non-planar. For example, each mating finger 350 may be angled transverse to the plane of the corresponding base 330. For example, in the illustrated embodiment, the mating finger 350 may be angled downward relative to the mating beam 332. The mating fingers 350 are stacked within the contact stack 304. The mating fingers 350 may be angled in other directions in alternative embodiments, such as being angled upward. In the illustrated embodiment, the mating fingers 350 are angled at approximately 45°; however, the mating fingers 350 may be angled at other angles in alternative embodiments. Angling the mating fingers 350 provides a flat surface for mating to the bus bar 102. Angling the mating fingers 350 increases the lengths of the mating beams 332. Angling the mating fingers 350 may induce torque when mating with the bus bar 102.

In an exemplary embodiment, the contacts 406 are non-planar. For example, each mating finger 450 may be angled transverse to the plane of the corresponding base 430. For example, in the illustrated embodiment, the mating finger 450 may be angled downward relative to the mating beam 432. The mating fingers 450 are stacked within the contact stack 404. The mating fingers 450 may be angled in other directions in alternative embodiments, such as being angled upward. In the illustrated embodiment, the mating fingers 450 are angled at approximately 45°; however, the mating fingers 450 may be angled at other angles in alternative embodiments. Angling the mating fingers 450 provides a flat surface for mating to the bus bar 102. Angling the mating fingers 450 increases the lengths of the mating beams 432. Angling the mating fingers 450 may induce torque when mating with the bus bar 102.

Figure 7:
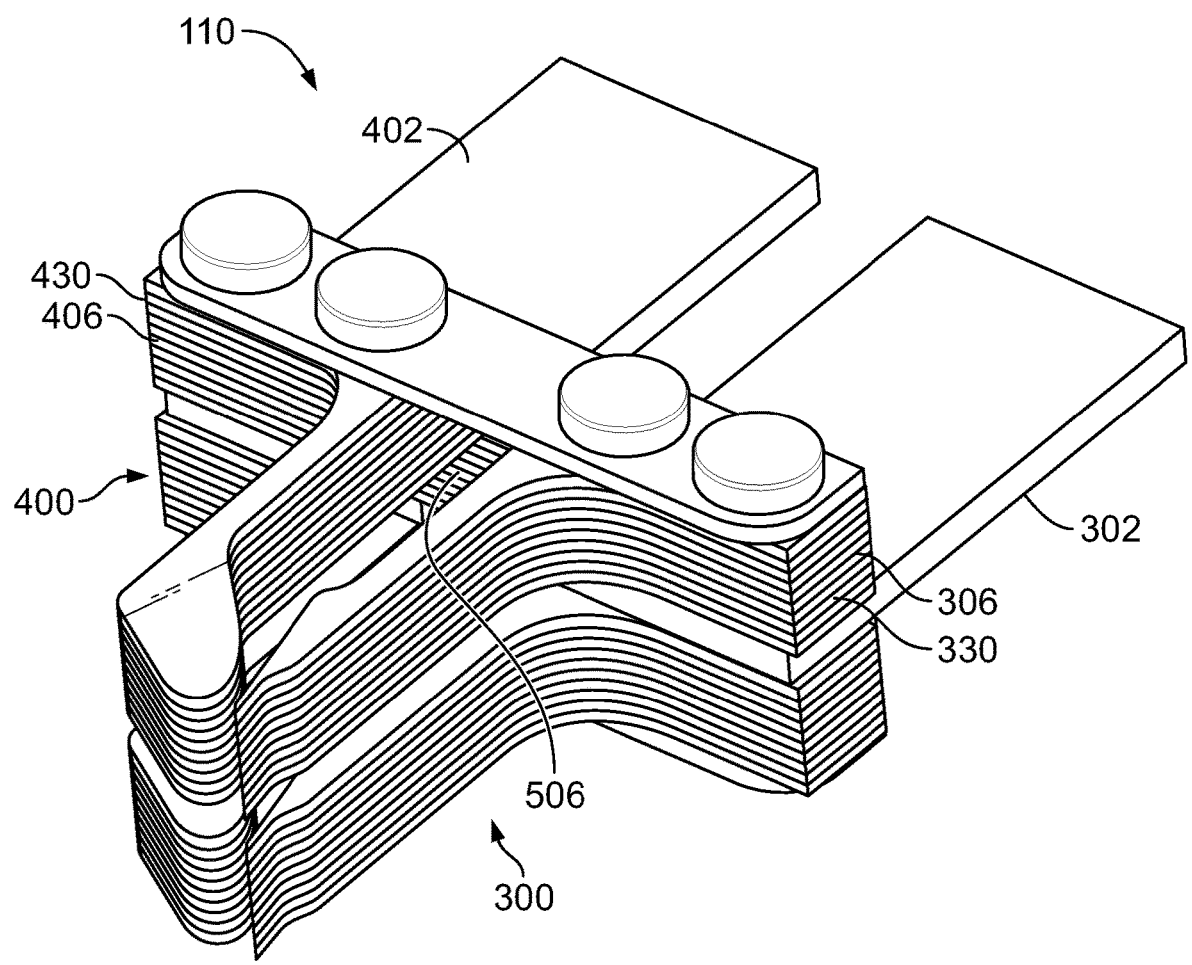
FIG. 7 is a front perspective view of the power connector in accordance with an exemplary embodiment.

FIG. 7 is a front perspective view of the power connector 110 in accordance with an exemplary embodiment. FIG. 7 illustrates the power connector 110 utilizing integrated contacts 506 between the contacts 306 and the contacts 406. For example, the contacts 306 and the contacts 406 may be stamped and formed with the contacts 506 therebetween. The bases 330 of the first contacts 306 are formed integral with the bases 430 of the second contacts 406 to electrically connect the first power terminal 300 and the second power terminal 400. The integrated power terminal may be used as a single pull power terminal having single polarity. The integrated power terminal may be used to electrically connect with both plates 302, 402 having the same polarity (for example, both having a positive charge or both having a negative charge).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power connector comprising:
a first power terminal having a first contact stack and a first plate for termination to a first power element, the first contact stack having first contacts separate and discrete from each other and separate and discrete from the first plate, the first contacts being mechanically and electrically coupled together in the first contact stack, each of the first contacts having a base and a mating beam extending from the base, the bases of the first contacts being aligned with each other and being mechanically and electrically coupled to the first plate, the mating beams extending forward of an end of the first plate; and a second power terminal having a second contact stack and a second plate for termination to a second power element, the second contact stack having second contacts separate and discrete from each other and separate and discrete from the second plate, the second contacts being mechanically and electrically coupled together in the second contact stack, each of the second contacts having a base and a mating beam extending from the base, the bases of the second contacts being aligned with each other and being mechanically and electrically coupled to the second plate, the mating beams extending forward of an end of the second plate; and a housing including an end wall and at least one fastener, the end wall extending along each of the bases of the first contacts and each of the bases of the second contacts, the at least one fastener secured to the end wall to mechanically and electrically couple the bases of the first contacts to the first plate and the bases of the second contacts to the second plate;

wherein the first power terminal and the second power terminal are arranged such that the mating beams of the first power terminal and the mating beams of the second power terminal oppose each other across a mating slot configured to receive a bus bar, the mating beams of the first power terminal being configured to mechanically and electrically engage a first bus rail at a first side of the bus bar and the mating beams of the second power terminal being configured to mechanically and electrically engage a second bus rail at a second side of the bus bar.

2. The power connector of claim 1, wherein the mating beams of adjacent ones of the first contacts within the first contact stack are independently movable relative to each other and wherein the mating beams of adjacent ones of the second contacts within the second contact stack are independently movable relative to each other.

3. The power connector of claim 1, wherein the bases of adjacent ones of the first contacts within the first contact stack abut against each other and the mating beams of the adjacent ones of the first contacts within the first contact stack abut against each other, and wherein the bases of adjacent ones of the second contacts within the second contact stack abut against each other and the mating beams of the adjacent ones of the second contacts within the second contact stack abut against each other.

4. The power connector of claim 1, wherein the first plate includes an opening and the bases of the first contacts include openings aligned with the opening of the first plate, the second plate includes an opening and the bases of the second contacts includes openings aligned with the opening of the second plate, the at least one fastener includes a first fastener passing through the opening in the first plate and the openings in the bases of the first contacts and the at least one fastener includes a second fastener passing through the opening in the second plate and the openings in the bases of the second contacts.

5. The power connector of claim 1, wherein the first contacts are stamped and formed contacts having shear edges facing the mating slot, the second contacts being stamped and formed contacts having shear edges facing the mating slot.

6. The power connector of claim 1, wherein for each of the first contacts, the mating beam has a mating finger at a tip of the mating beam, the mating finger being angled transverse to a plane of the base of the corresponding one of the first contacts.

7. The power connector of claim 1, wherein the first contacts are arranged horizontally within the first contact stack, the mating beams of the first contacts having mating fingers at tips of the mating beams, the mating fingers being angled non-horizontally for mating with the bus bar.

8. The power connector of claim 1, wherein the first plate is aligned with the second plate along a plane oriented perpendicular to the mating slot, the first plate being spaced apart from the second plate by a gap aligned with the mating slot.

9. The power connector of claim 1, wherein the first power terminal includes a third contact stack having third contacts separate and discrete from each other and separate and discrete from the first plate, the third contacts being mechanically and electrically coupled together in the third contact stack, each third contact having a base and a mating beam extending from the base, the bases of the third contacts being aligned with each other and being mechanically and electrically coupled to the first plate, the mating beams extending forward of the end of the first plate, and wherein the second power terminal includes a fourth contact stack having fourth contacts separate and discrete from each other and separate and discrete from the second plate, the fourth contacts being mechanically and electrically coupled together in the fourth contact stack, each fourth contact having a base and a mating beam extending from the base, the bases of the fourth contacts being aligned with each other and being mechanically and electrically coupled to the second plate, the mating beams extending forward of the end of the second plate, and wherein the first power terminal and the second power terminal are arranged such that the mating beams of the third contacts and the mating beams of the fourth contacts oppose each other across the mating slot, the mating beams of the third contacts being configured to mechanically and electrically engage the first bus rail at the first side of the bus bar and the mating beams of the fourth contacts being configured to mechanically and electrically engage the second bus rail at the second side of the bus bar.

10. The power connector of claim 9, wherein the bases of the third contacts are aligned with the bases of the first contacts on opposite sides of the first plate and wherein the bases of the fourth contacts are aligned with the bases of the second contacts on opposite sides of the second plate, the at least one fastener sandwiching the first plate between the bases of the first contacts and the bases of the third contacts and sandwiching the second plate between the bases of the second contacts and the bases of the fourth contacts.

11. The power connector of claim 9, wherein the mating beams of the third contacts are aligned with the mating beams of the first contacts and the mating beams of the fourth contacts are aligned with the mating beams of the second contacts.

12. The power connector of claim 1, wherein the first power terminal is electrically isolated from the second power terminal as dual pole power terminals having opposite polarity.

13. The power connector of claim 1, wherein the first power terminal is electrically connected to the second power terminal as single pole power terminals having single polarity.

14. The power connector of claim 13, wherein the end wall is electrically conductive between the first power terminal and the second power terminal.

15. The power connector of claim 1, wherein the bases of the first contacts are formed integral with corresponding ones of the bases of the second contacts to electrically connect the first power terminal and the second power terminal.

16. A power connector comprising:
a first power terminal having a first upper contact stack, a first lower contact stack and a first plate sandwiched between the first upper contact stack and the first lower contact stack, the first plate for termination to a first power element, the first upper contact stack having first upper contacts separate and discrete from each other and separate and discrete from the first plate, the first lower contact stack having first lower contacts separate and discrete from each other and separate and discrete from the first plate, each of the first upper contacts having a first upper base and a first upper mating beam extending from the first upper base, each of the first lower contacts having a first lower base and a first lower mating beam extending from the first lower base, the first upper bases being aligned with the first lower bases on opposite sides of the first plate, the first upper mating beams being aligned with the first lower mating beams forward of an end of the first plate; and
a second power terminal having a second upper contact stack, a second lower contact stack and a second plate sandwiched between the second upper contact stack and the second lower contact stack, the second plate for termination to a second power element, the second upper contact stack having second upper contacts separate and discrete from each other and separate and discrete from the second plate, the second lower contact stack having second lower contacts separate and discrete from each other and separate and discrete from the second plate, each of the second upper contacts having a second upper base and a second upper mating beam extending from the second upper base, each of the second lower contacts having a second lower base and a second lower mating beam extending from the second lower base, the second upper bases being aligned with the second lower bases on opposite sides of the second plate, the second upper mating beams being aligned with the second lower mating beams forward of an end of the second plate; and
a housing including an upper end wall, a lower end wall and at least one fastener, the upper end wall extending along each of the first and second upper bases, the lower end wall extending along each of the first and second lower bases, the at least one fastener secured to at least one of the upper end wall and the lower end wall to mechanically and electrically couple the first upper contacts and first lower contacts to the first plate and the second upper contacts and second lower contacts to the second plate;
wherein the first power terminal, and the second power terminal are arranged such that the first upper mating beams oppose the second upper mating beams and the first lower mating beams oppose the second lower mating beams across a mating slot, the mating slot configured to receive a bus bar, the first upper mating beams and the first lower mating beams being configured to mechanically and electrically engage a first bus rail at a first side of the bus bar and the second upper mating beams and the second lower mating beams being configured to mechanically and electrically engage a second bus rail at a second side of the bus bar.

17. The power connector of claim 16, wherein the mating beams of adjacent ones of the first contacts within the first upper contact stack are independently movable relative to each other,
wherein the mating beams of adjacent ones of the first contacts within the first lower contact stack are independently movable relative to each other,
wherein the mating beams of adjacent ones of the second contacts within the second upper contact stack are independently moveable relative to each other, and
wherein the mating beams of adjacent ones of the second contacts within the second lower contact stack are independently movable relative to each other.

18. The power connector of claim 16, wherein the first plate is aligned with the second plate along a plane oriented perpendicular to the mating slot, the first plate being spaced apart from the second plate by a gap aligned with the mating slot.

19. The power connector of claim 16, wherein the first upper bases are aligned with the first lower bases on opposite sides of the first plate and wherein the second upper bases are aligned with the second lower bases on opposite sides of the second plate, the at least one fastener sandwiching the first plate between the first upper bases and the first lower bases and sandwiching the second plate between the second upper bases and the second lower bases.

20. A power system for a bus bar having a first bus rail and a second bus rail, the power system comprising:
a first power element having a first mating interface;
a second power element having a second mating interface; and
a power connector configured to electrically connect the first bus rail with the first power element and the second bus rail with the second power element, the power connector comprising:
a first power terminal having a first contact stack and a first plate terminated to the first power element, the first contact stack having first contacts separate and discrete from each other and separate and discrete from the first plate, the first contacts being mechanically and electrically coupled together in the first contact stack, each of the first contacts having a base and a mating beam extending from the base, the bases of the first contacts being aligned with each other and being mechanically and electrically coupled to the first plate, the mating beams extending forward of an end of the first plate; and
a second power terminal having a second contact stack and a second plate terminated to the second power element, the second contact stack having second contacts separate and discrete from each other and separate and discrete from the second plate, the second contacts being mechanically and electrically coupled together in the second contact stack, each second of the second contacts contact having a base and a mating beam extending from the base, the bases of the second contacts being aligned with each other and being mechanically and electrically coupled to the second plate, the mating beams extending forward of an end of the second plate; and a housing including an end wall and at least one fastener, the end wall extending along each of the bases of the first contacts and each of the bases of the second contacts, the at least one fastener secured to the end wall to mechanically and electrically couple the bases of the first contacts to the first plate and the bases of the second contacts to the second plate;

wherein the first power terminals and the second power terminals are arranged such that the mating beams of the first power terminal and the mating beams of the second power terminal oppose each other across a mating slot configured to receive the bus bar, the mating beams of the first power terminal being configured to mechanically and electrically engage the first bus rail at a first side of the bus bar and the mating beams of the second power terminal being configured to mechanically and electrically engage the second bus rail at a second side of the bus bar; and wherein the first power terminal electrically connects the first power element to the first bus rail and the second power terminal electrically connects the second power element to the second bus rail at a separable mating interface with the bus bar.

* * * * *